(12) United States Patent
Eilmsteiner et al.

(10) Patent No.: US 8,282,766 B2
(45) Date of Patent: Oct. 9, 2012

(54) ETCH APPARATUS AND METHOD OF ETCHING SILICON NITRIDE

(75) Inventors: Gerhard Eilmsteiner, Leoben (AT); Johann Ninaus, Gross St. Florian (AT)

(73) Assignee: Austriamicrosystems AG, Unterpremstätten (AT)

( * ) Notice: Subject to any disclaimer, the term of this patent is extended or adjusted under 35 U.S.C. 154(b) by 743 days.

(21) Appl. No.: 12/274,072

(22) Filed: Nov. 19, 2008

(65) Prior Publication Data

US 2010/0124824 A1    May 20, 2010

(51) Int. Cl.
*H01L 21/306* (2006.01)
(52) U.S. Cl. .......... 156/345.18; 156/345.11; 156/345.15
(58) Field of Classification Search ............. 156/345.15, 156/345.18, 345.11
See application file for complete search history.

(56) References Cited

U.S. PATENT DOCUMENTS

| | | | |
|---|---|---|---|
| 4,530,862 A * | 7/1985 | Kerzel | ............................ 427/445 |
| 5,431,339 A * | 7/1995 | Yoda | .............................. 236/46 R |
| 5,779,927 A | 7/1998 | Lo | |
| 5,938,885 A | 8/1999 | Huang et al. | |
| 6,207,068 B1 | 3/2001 | Glick et al. | |
| 6,780,277 B2 * | 8/2004 | Yokomizo et al. | ........ 156/345.11 |
| 6,837,252 B2 * | 1/2005 | Bergman | ........................ 134/105 |
| 2002/0144713 A1 * | 10/2002 | Kuo et al. | ........................... 134/18 |
| 2008/0035609 A1 | 2/2008 | Kashkoush et al. | |
| 2008/0066864 A1 | 3/2008 | Ballantine et al. | |
| 2010/0124824 A1 * | 5/2010 | Eilmsteiner et al. | ........... 438/757 |

FOREIGN PATENT DOCUMENTS

| | | |
|---|---|---|
| EP | 0 474 482 | 3/1992 |
| WO | WO 02/27310 | 4/2002 |

OTHER PUBLICATIONS

Wolf, S. et al., "Silicon Processing for the VLSI Era—Isolation Technologies for Integrated Circuits", Latice Press, vol. 11, pp. 16-27.
Clark, S., "Silicon Nitride Etch—Chemical Etchng of Silicon Nitride ($Si_3N_4$) with Hot Phosporic Acid ($H_3PO_4$)", Bold Technologies Inc., 1998-2000, (6 pages).

* cited by examiner

*Primary Examiner* — Sylvia R. MacArthur
(74) *Attorney, Agent, or Firm* — Cozen O'Connor

(57) ABSTRACT

An etch apparatus, especially for silicon nitride etch includes a control unit coupled to at least one component of the group of components comprising heater current sensors, a pump transducer sensor and a flow sensor provided for a diluting liquid. A malfunction of the apparatus is avoided and the etching process can be controlled for better performance.

11 Claims, 2 Drawing Sheets

ETCH APPARATUS AND METHOD OF ETCHING SILICON NITRIDE

FIELD OF THE INVENTION

This invention is in the field of semiconductor manufacturing technology and etch hardware configurations.

BACKGROUND OF THE INVENTION

Silicon nitride ($Si_3N_4$) plays an important role in semiconductor manufacturing and serves to form, for example, antireflective coatings, protective layers of IC chips, and dielectric films of capacitors. The oxidation rate of $Si_3N_4$ is by several orders of magnitude lower than that of silicon. This property is employed to generate various kinds of electric insulations by the method of LOCOS (local oxidation of silicon), which is described, for example, in S. Wolf and R. N. Tauber, "Silicon processing for the VLSI era", volume 2, Latice Press. While plasma etching is the appropriate method for structuring a $Si_3N_4$ layer prior to field oxidation, it is not applicable after the oxidation because of its low selectivity between $Si_3N_4$ and silicon oxide.

A high selectivity can be achieved by means of wet chemistry. Hot phosphoric acid ($H_3PO_4$) is conventionally used to etch $Si_3N_4$. The chemical reactions are summarized in the following equation, presented in S. Clark, "Silicon Nitride Etch", Bold Technologies technical notes:

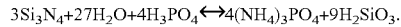

$$3Si_3N_4 + 27H_2O + 4H_3PO_4 \leftrightarrow 4(NH_4)_3PO_4 + 9H_2SiO_3.$$

According to this equation, water hydrolyzes the silicon nitride to form hydrous silica and ammonia, which remains in the solution in the form of ammonium phosphate. During the etching of the nitride layer, hydrated silicon dioxide ($H_2OSiO_2$) is formed, which inhibits the etching of $SiO_2$. This results in a selectivity of 50:1 or higher between nitride and oxide.

The etch rates of Si, $SiO_2$ and $Si_3N_4$ in phosphoric acid are investigated in the paper of W. van Gelder and V. E. Hauser, "The etching of silicon nitride in phosphoric acid with silicon dioxide as mask", J. Electrochem. Soc. 114, p. 869 (1967). The higher the temperature and the higher the water content, the higher is the etch rate of silicon nitride. To obtain satisfying process results, it is not sufficient to control the temperature of the $H_3PO_4$; also the water content has to be maintained stable. Therefore the effect of the temperature on the acid concentration has also to be taken into account. Running the etch bath at a constant water content at the corresponding boiling point is a suitable means of maintaining stable conditions in the etch bath. The relationship between the concentration of the phosphoric acid and the boiling point temperature is shown in the diagram of FIG. 2, which was taken from the aforementioned paper.

A constant temperature can be maintained by regulating the acid concentration. This can be accomplished with a reflux system, in which the steadily evaporating water is condensed and fed back to the etch bath. As such a system is not closed, water must be added to ensure a stable water content of the phosphoric acid. As the hydrous silica generated in the etch process is responsible for the high selectivity but is not present from the very beginning of the etching process, the selectivity between nitride and oxide may increase from typically 25:1 to typically 100:1, when the etch bath reaches its saturation with $SiO_2$.

U.S. Pat. No. 5,779,927 discloses a reflux etcher, in which the liquid acid evaporant is condensed and returned to the etch bath by way of a pH meter, whose output is used to control the flow of additional water into the main system. Alternatively, a conductivity meter, located in the etch bath, may be used for the same purpose.

U.S. Pat. No. 5,938,885 discloses a method for a continuous control of the etch rates by means of a gravity analysis of a sample stream from the $H_3PO_4$ solution in the etch bath chamber. Depending on the gravity analysis, water is added to the etchant or heat is supplied to reduce the water content.

U.S. Pat. No. 6,207,068 B1 discloses a silicon nitride etch bath system, in which a secondary filter that is operatively connected to a heat exchanger is used for extracting silicon dioxide particles in a small portion of phosphoric acid removed from an etching bath. The arrangement enables to prevent the concentration of $SiO_2$ from reaching the saturation level.

US 2008/0035609 A1 discloses a method which controls the concentration ratio of the components dynamically on the basis of a particle count within the etchant and stabilizes the etch rate by adding both water and $H_2SO_4$.

US 2008/0066864 A1 discloses an etch apparatus, which makes use of a dissolver included in a recirculation path coupled to a tank. The dissolver comprises a porous carbon matrix filter that is coated with silicon nitride, which is dissolved into the etchant at a controlled dissolution rate.

EP 0 474 482 A1 discloses a method of etching silicon nitride with $H_3PO_4$, in which the temperature of the etchant is detected and a solution of $H_3PO_4$ of low acid concentration is added to the etchant if the temperature increases above a predetermined value.

WO 02/27310 A1 discloses a method of measuring the water content of a liquid mixture contained in a tank. The temperature of a cooling medium passing the tank is measured at an inlet and at an outlet. The temperature difference is used to compute the water content of the liquid mixture.

SUMMARY OF THE INVENTION

One aspect of the invention is directed to an etch apparatus, which is especially suited to silicon nitride etch. The etch apparatus comprises a process tank provided for an etch bath and for the placement of objects that are to be etched. It further comprises a reservoir provided for a wet chemical etchant, which is connected to the process tank, a supply of a diluting liquid (e.g. Dl water), a recirculation line connected with the process tank, a recirculation pump connected with the recirculation line, a heater that is thermally connected with the recirculation line, a temperature detector thermally connected with the process tank, and a control unit connected with the temperature detector.

In an embodiment of the invention, the heater comprises at least two heater units, each heater unit being provided with a current sensor. The control unit is connected with the current sensors and registers the currents individually.

In a further embodiment of the invention, the recirculation pump comprises a transducer sensor and/or a speed sensor, and the control unit is connected with the transducer sensor and/or the speed sensor, respectively, to control the operation of the pump.

In a further embodiment of the invention, the supply of the diluting liquid is provided with a valve and a flow sensor, and the control unit is connected with the flow sensor.

In further embodiments of the invention, some or all of the features of the aforesaid embodiments can be combined.

The wet chemical etchant can be phosphoric acid. The diluting liquid can be Dl water (demineralized or deionized water). The heater can comprise an infrared heater. The temperature sensor can be an RTD (resistance temperature detector).

DETAILED DESCRIPTION OF THE DRAWINGS

Figure 1:
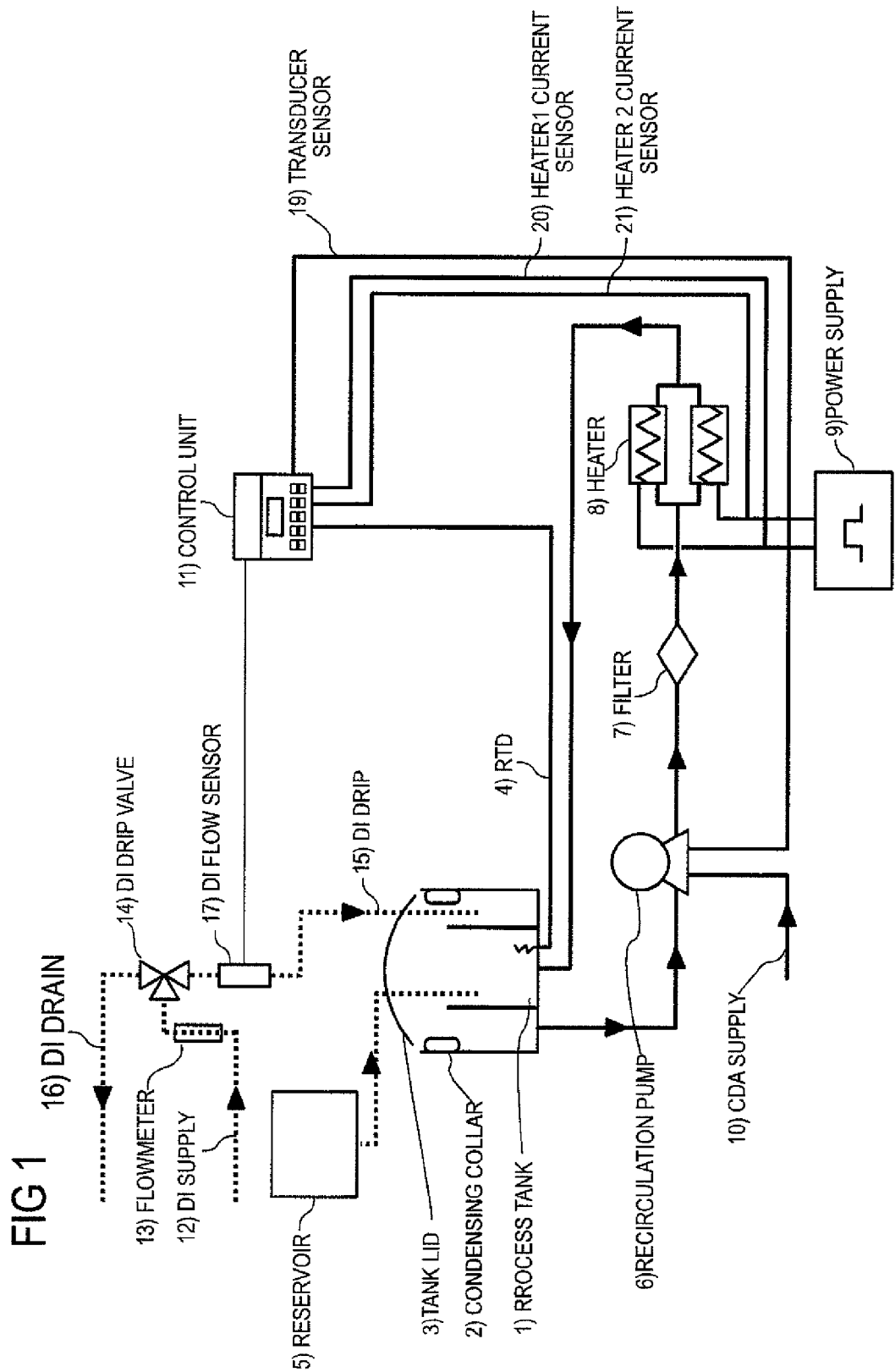
FIG. 1 schematically shows an arrangement of components of an embodiment of the etch apparatus.

FIG. 1 shows an embodiment of the etch apparatus comprising several features that will be described separately in conjunction with various further embodiments. The arrangement shown in FIG. 1 comprises a process tank 1, which is provided for an etch bath containing an etchant and can be made from quartz, for instance. The objects to be etched, for example semiconductor wafers, are immersed in the etch bath. If the process tank 1 is provided for 200-mm wafers and a batch size of 50 wafers, for example, its volume can be typically approximately 50 liters. The process tank 1 is preferably covered with a tank lid 3 to suppress the leakage of vapor and facilitate the maintenance of a constant water content in the etch bath. The process tank 1 can be provided with an optional condensing collar 2, which can comprise a coil of a liquid-cooled tube, to enhance the efficiency of the condensation of evaporated solvent, especially water.

The temperature of the etchant in the process tank 1, especially of a solution of $H_3PO_4$, is measured with a temperature detector, which is thermally connected with the process tank 1. The temperature detector is preferably an RTD 4 (resistance temperature detector) but can be any other temperature detector that is suitable for this application.

A reservoir 5 is provided for a wet chemical etchant and connected to the process tank 1. If silicon nitride is to be etched, this reservoir 5 can be provided for $H_3PO_4$. If $H_3PO_4$ is used as etchant, it is preferably kept at elevated temperatures, typically in the range from 150° C. to 180° C.

The process tank 1 is connected with a recirculation line or recirculation loop comprising a recirculation pump 6, optionally a filter 7, and a heater 8, which may be an IR (infrared) heater. A pneumatically driven recirculation pump 6 is especially suitable for the application with hot $H_3PO_4$ and is preferably connected to a CDA (clean dry air) supply 10. A filter 7 is preferably provided to extract particles from the liquid. The heater 8 can be run at a constant average power by means of a pulsed operation of the power supply 9. In this case, the ratio of the durations of the on- and off-states determines the overall power level. The on/off ratio is typically 1:1; in this case, the steady-state average heating power is half the maximal power. In the application of this apparatus, the temperature is controlled by the acid concentration and not by adjusting the heat source proportionally to the heat consumption. Therefore the heater is operated at a power level that is above a minimal power level required for the maintenance of the desired temperature. Energy not serving to maintain the temperature is dissipated by evaporation of the liquid.

As the system is not completely closed, a solvent, especially water, has to be added during the operation of the apparatus to compensate for the continuous loss of vapor. To this end, a supply of a diluting liquid is provided, which, in the described embodiment, is demineralized water, abbreviated Dl in the following. A Dl drip 15 connected with the process tank 1 is fed from a Dl supply 12 via a flowmeter 13 and a Dl drip valve 14. If no Dl water is to be added to the etch bath in the process tank 1, the Dl drip valve 14 diverts the Dl water to a Dl drain 16.

Figure 2:
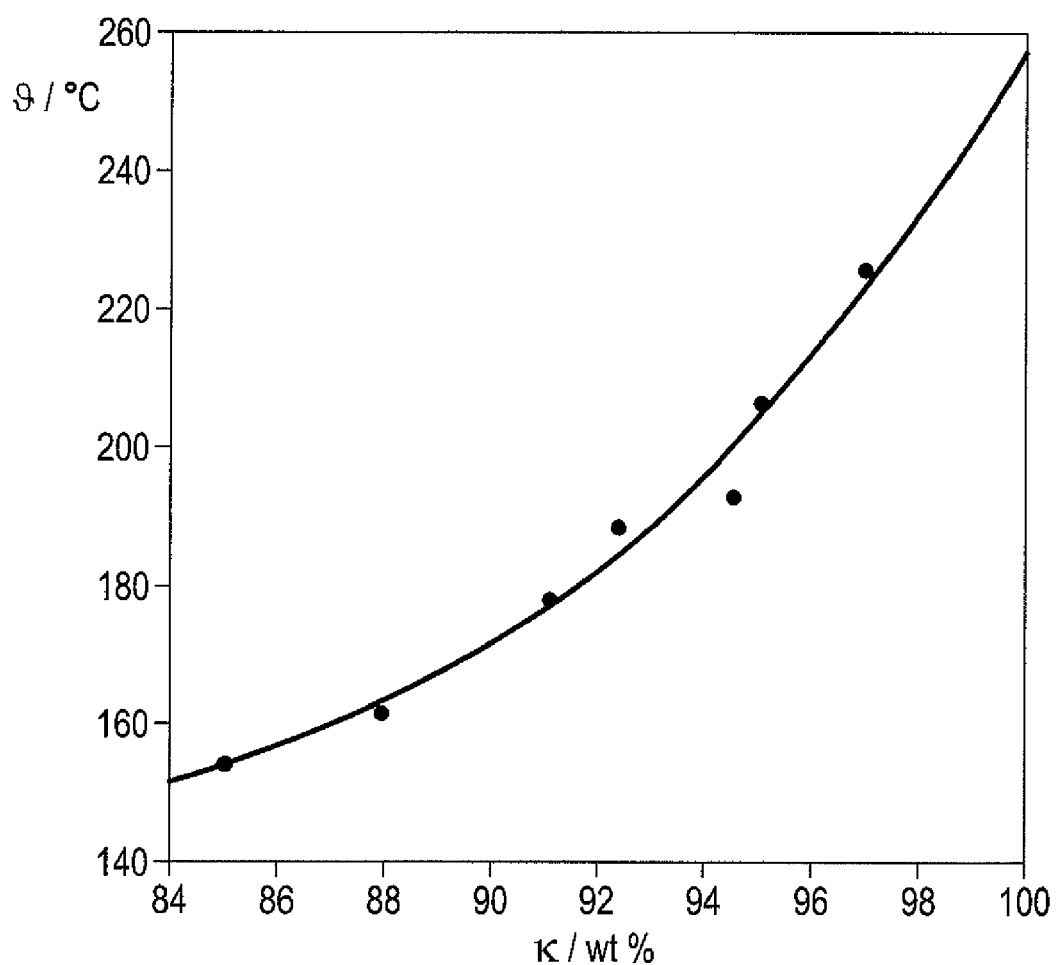
FIG. 2 is a diagram showing the dependence of the boiling point temperature θ on the concentration κ of the acid.

FIG. 2 reproduces a diagram showing the dependence of the boiling point temperature θ, measured in ° C., of an aqueous solution of $H_3PO_4$ on the concentration κ of $H_3PO_4$, measured in wt % (percent of weight). The regulation of the whole system is based on this functional dependence. If the temperature θ of the etch bath in the process tank 1 is measured to be above a predetermined value $\theta_1$, e.g. $\theta > \theta_1 = 160°$ C., the concentration of $H_3PO_4$ is supposed to be higher than the corresponding value $\kappa(\theta_1)$, which can be read from the diagram of FIG. 2, e.g. $\kappa > \kappa(160°$ C.$) \approx 88$ wt %. In this case diluting liquid, preferably Dl water, is added to the etch bath, so that its temperature θ decreases. When the temperature θ drops to a further predetermined value $\theta_0$, no more diluting liquid is added. Then the concentration of the phosphoric acid will gradually recover owing to the further evaporation of water. Thus the temperature θ is kept between the predetermined values $\theta_0$ and $\theta_1$, $\theta_0 \leq \theta \leq \theta_1$, and the concentration of the phosphoric acid is simultaneously kept between the corresponding values.

A stable etching process and an effective run of the recirculation line can only be achieved if the values of important parameters are controlled and maintained in appropriate ranges. Among these parameters are the heating power, the speed of the recirculation pumps the Dl drip rate, the wafer load, and the actual throughput. The failure of only one lamp of one of the heater units, for instance, may cause a malfunction of the recirculation line, which is then no longer able to maintain a stable chemical ratio in the etch bath. This cannot be detected by merely controlling the temperature of the etch bath, because the remaining heating power of the other lamps may still suffice to maintain the desired temperature.

In an embodiment of the etch apparatus, the heater 8 comprises at least two heater units, each heater unit being provided with an individual current sensor. Each heater unit may contain three individual lamps, for example, each lamp having a maximal power consumption of typically approximately 7 kW. The lamps can preferably be operated in a pulsed mode. By means of the individual current sensors and a control unit 11, the currents of both heater units can be controlled separately. FIG. 1 shows a connection 20 between the control unit 11 and one of the heater units, designated by "heater 1 current sensor", and a further connection 21 between the control unit 11 and the other one of the heater units, designated by "heater 2 current sensor".

The currents through the heater units are registered individually and can by analysed independently. By setting appropriate current limits, the performance of the etch apparatus can be controlled and various hardware problems can be detected. If the current consumption of one of the heater units drops suddenly by a predetermined amount because a lamp fails, the etching process can be stopped and the heater unit can be repaired to ascertain stable process conditions. A possible degradation of a heater unit over time can also be monitored. This enables to detect not only the operation of the lamps but also the state of the electric contacts, for example connecting contacts of the lamps and sockets, which tend to corrode in the chemically aggressive environment and may show a higher contact resistance over time. Because of the continuous separate control of the heater units by means of the control unit, which is made possible by the individual current sensors, a timely replacement of a spare part is possible, and there is no risk that the etching process runs out of control because of a malfunction of the heater. The detailed monitoring of the heating power also helps to restart the system after the heater has been changed and to reproduce the previous operating conditions. If more detailed information about the performance of the heater units is available, various tools can be matched to the etch apparatus in a much easier way than heretofore and repair times can be minimized.

The recirculation rate, which also has a major impact on the etching process, depends on the pump speed. If a pneumatically driven recirculation pump 6 is applied, the average pressure in the CDA supply line is an important parameter. A further embodiment of the etch apparatus is provided with a pump transducer sensor, which monitors the CDA supply pressure. A connection of the pump transducer sensor with a control unit 11 allows the control of the CDA supply to maintain stable operating conditions of the recirculation pump 6. This connection is designated by "transducer sensor 19" in FIG. 1. Preferably, not only the average pressure of the CDA supply 10 is detected but also intermittent pressure drops, which usually occur in every cycle of the recirculation pump and are a characteristic of the type of pump that is preferably applied in the etch apparatus. Due to the recurring pressure drops, the pump speed can be determined by counting the pressure drops per time. If the pressure drops become more pronounced, this is a strong indication that the pump has an internal leak. It is therefore possible to detect or even to predict a malfunction or failure of the pump by controlling whether the pressure drops are still within the limits of a predetermined range of suitable pressure values. The application of a transducer sensor is preferred to a speed sensor that is mounted inside the pump, because the speed sensor is exposed to an aggressive chemical environment there.

As the etch solution becomes saturated with $SiO_2$ in the course of the etching process, more and more particles of $SiO_2$ are precipitated. The generation of particles may be accelerated by variations of the process parameters. The suspension of the particles in the etch solution poses severe problems with the filtering of the chemicals, because the filter 7 in the recirculation line is prone to being clogged. If this happens, the pumping speed decreases. In this case the control unit 11 registers a decrease of the pump speed by means of the transducer sensor, while other relevant parameters remain constant. If a lower limit of the pump speed is predetermined in such a manner that a pump speed below this limit will indicate a clogging of the filter, a continuous monitoring of the pump speed allows a timely change of the filter before it gets clogged.

A further embodiment of the etch apparatus is provided with a sophisticated supply of the diluting liquid, especially a DI drip system. A DI flow sensor 17 is arranged between the DI drip valve 14 and the DI drip 15, which is directly connected to the process tank 1. By a direct measurement of the flow of the diluting liquid, the DI flow sensor 17 reliably determines the amount of diluting liquid that is added to the etch bath. The use of a digital flow sensor offers the further possibility to feed the determined value of the flow rate online into the tool-software, and in case of any malfunction the etching process can be stopped immediately.

The described embodiments comprise improvements of conventional etching devices without necessitating any substantial hardware reengineering. The system comprising the etch apparatus is run in equilibrium with the etch bath at the boiling point (for highest etch rates and temperature stability), and the etch bath is saturated with $SiO_2$ in order to achieve the optimum selectivity to oxide. In order to avoid problems caused by deviations from the equilibrium state, several hardware changes are proposed to run the etch process within tighter limits for more process robustness. Some or all of the features of the described embodiments can be combined. An embodiment comprising all the features in combination is represented in the scheme of FIG. 1.

A method of etching silicon nitride according to this invention may comprise one, several or all of the following method steps: registering the currents of heater units individually to control the function of the heater units separately; registering at least one of the pump speed and the pumping pressure to control the operation of the recirculation line; and registering the temperature of the etch bath and a flow of the diluting liquid into the etch bath to control the concentration of the etchant in the etch bath.

Although the present invention and its advantages have been described in detail, it should be understood that various changes, substitutions and alterations can be made herein without departing from the spirit and scope of the invention as defined by the appended claims.

We claim:
1. An etch apparatus, comprising:
   a process tank provided for an etch bath;
   a reservoir provided for a wet chemical etchant, the reservoir being connected to the process tank;
   a supply of a diluting liquid;
   a drip valve for controlling the amount of the diluting liquid in the supply;
   a drip directly connected to the process tank;
   a flow sensor arranged between the drip and the drip valve;
   a recirculation line connected with the process tank;
   a recirculation pump provided for the recirculation line, wherein the recirculation pump comprises a transducer sensor;
   a heater thermally connected with the recirculation line, the heater comprising at least two heater units, each heater unit having a current sensor, and the heater being operated at a power level that is required for maintenance of the etch bath;
   a temperature detector thermally connected with the process tank; and
   a control unit coupled to the temperature detector, the tranducer sensors, the current sensor, and the flow sensor, the control unit controlling the temperature of the process tank based on the acid concentration of the etch bath.
2. The etch apparatus of claim 1, wherein the control unit controls the operation of the heater units individually in response to values of the currents detected by the current sensors.
3. The etch apparatus of claim 1, wherein the control unit is provided to control the operation of the recirculation pump in response to detection of recurring pressure drops and an average pumping speed.
4. The etch apparatus according to claim 1, wherein the reservoir that is provided for a wet chemical etchant is provided for phosphoric acid.
5. The etch apparatus according to claim 1, wherein the supply of a diluting liquid is provided for demineralized water.
6. The etch apparatus according to claim 1, wherein the heater comprises an infrared heater.
7. An etch apparatus, comprising:
   a process tank provided for an etch bath;
   a reservoir provided for a wet chemical etchant, the reservoir being connected to the process tank;
   a supply of a diluting liquid;
   a drip valve for controlling the amount of the diluting liquid in the supply;
   a drip directly connected to the process tank;
   a flow sensor arranged between the drip and the drip valve;

a recirculation line connected with the process tank;

a recirculation pump provided for the recirculation line;

a heater thermally connected with the recirculation line, wherein the heater is operated at a power level that is required for maintenance of the etch bath;

a temperature detector thermally connected with the process tank; and a control unit coupled to the temperature detector and the flow sensor, the control unit controlling the temperature of the process tank based on the acid concentration of the etch bath.

8. The etch apparatus of claim 7, wherein the control unit controls the flow of a diluting liquid into the process tank.

9. The etch apparatus according to claim 7, wherein the reservoir that is provided for a wet chemical etchant is provided for phosphoric acid.

10. The etch apparatus according to claim 7, wherein the supply of a diluting liquid is provided for demineralized water.

11. The etch apparatus according to claim 7, wherein the heater comprises an infrared heater.

\* \* \* \* \*